United States Patent [19]
Pernyeszi

[11] Patent Number: 5,847,593
[45] Date of Patent: Dec. 8, 1998

[54] VOLTAGE DISCHARGE CIRCUIT FOR A PHOTOVOLTAIC POWER SOURCE

[75] Inventor: Joseph Pernyeszi, Scotts Valley, Calif.

[73] Assignee: Siemens Microelectronics, Inc

[21] Appl. No.: 822,742

[22] Filed: Mar. 25, 1997

[51] Int. Cl.⁶ .................................................. H03K 17/60
[52] U.S. Cl. ..................... 327/432; 327/428; 327/439; 327/440; 327/478
[58] Field of Search .................................. 327/428, 432, 327/434, 439, 440, 442, 478, 539; 323/313; 361/93

[56] References Cited

U.S. PATENT DOCUMENTS

| | | | |
|---|---|---|---|
| 4,777,387 | 10/1988 | Collins | 327/432 |
| 5,391,997 | 2/1995 | Meyer et al. | 327/440 |
| 5,418,381 | 5/1995 | Aizawa | 250/551 |
| 5,606,482 | 2/1997 | Witmer | 361/93 |
| 5,696,440 | 12/1997 | Harada | 323/313 |
| 5,723,915 | 3/1998 | Maher et al. | 307/131 |

*Primary Examiner*—Timothy P. Callahan
*Assistant Examiner*—Jung Ho Kim

[57] ABSTRACT

A circuit for discharging of a photovoltaic power source has a first and a second terminal and the circuit comprises a discharge circuit which is connected between the first and second terminal of the power source which comprises a controllable current source which is controlled by a band gap reference.

13 Claims, 4 Drawing Sheets

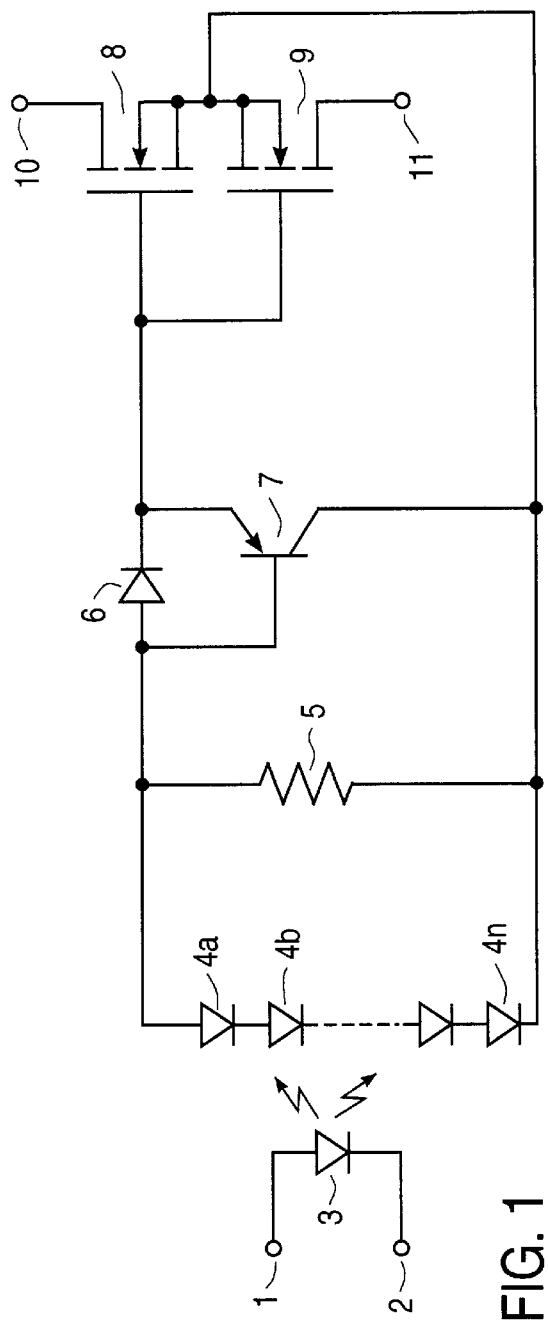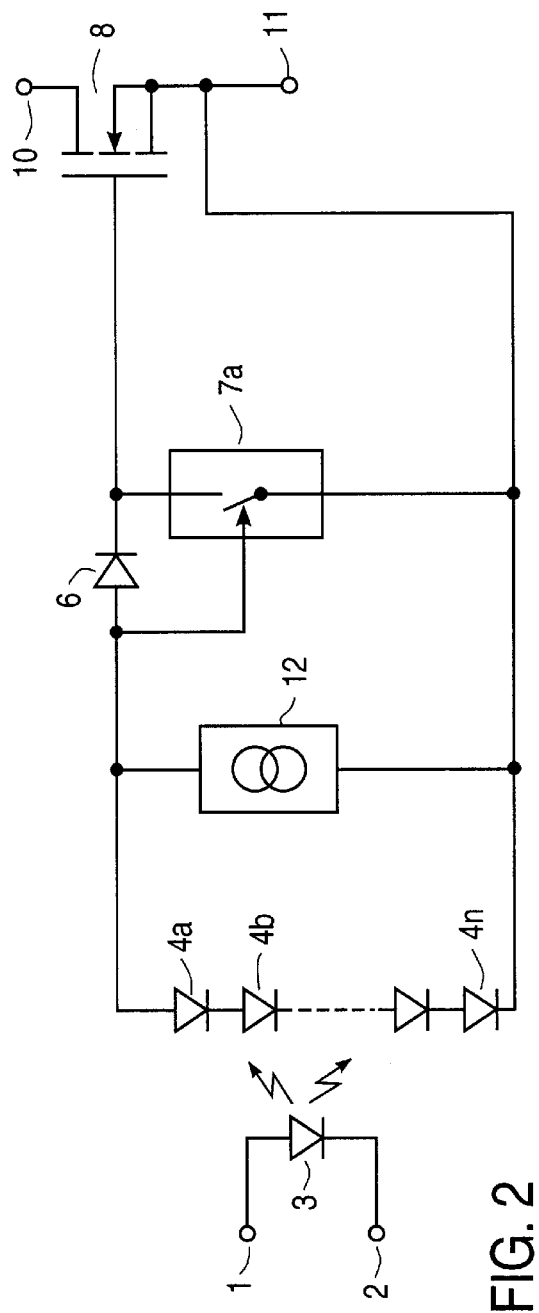
FIG. 1 (PRIOR ART)
FIG. 2

5,847,593

VOLTAGE DISCHARGE CIRCUIT FOR A PHOTOVOLTAIC POWER SOURCE

BACKGROUND

The present application is related to a circuit for discharging of a photovoltaic power source in an capacitively charged device.

The preferred embodiment of the present invention is described in connection with a solid state relay circuit. A similar solid state relay circuit is known in the art wherein a metal-oxide semiconductor field-effect transistor (MOSFET) is used as a switching device. The energy for switching the MOSFET is derived from a photovoltaic energy source such as a plurality of photo diodes connected in series. This energy source is driven by a light emitting diode (LED) optically coupled to these photo diodes. If activated, the energy source supplies the gate of the MOSFET with sufficient current for the MOSFET to be conductive.

Turning off the LED deactivates the photovoltaic energy source. For resistor is usually used to discharge the photovoltaic energy source and the input capacitance of the MOSFET. Since the photo current is very low, such as 1–2 $\mu$A, the resistor must have a high enough value so that it does not present an unacceptable load to the photo diode array. Such a resistor is 5–10 M$\Omega$. In integrated circuit components such resistors need a relatively large area on a chip.

Such a circuit arrangement is known from U.S. Pat. No. 4,777,387. For discharge of both the energy source and the switching device, the disclosed arrangement provides two elements. As shown in FIG. 1–3 of the above mentioned document a transistor 21 or a silicon-controlled rectifier (SCR) 21, 30 is responsible for discharging the gate—source capacitance. The energy source is discharged by a resistor 22.

Another circuit arrangement is shown in U.S. Pat. No. 4,931,656. FIG. 3–5 thereof show arrangements with a single discharging element. This element contains an SCR or a transistor which is kept in a non conductive state while the light source 20 is activating diodes 58, 72, 84. With the above arrangement discharging times of about 5 microseconds are attainable.

A further circuit arrangement comprising a solid state relay with optically controlled shunt is known from U.S. Pat. No. 4,864,126. This solid state relay uses an optically controlled shunt and series enhancement circuit between a photo diode array and an output device. To turn off the solid state relay the photo diode array is decoupled from the output device. In this way no discharge circuit for the photo diode array is needed. Similar circuit arrangements are known from U.S. Pat. No. 4,939,375 and U.S Pat. No. 4,902,901.

SUMMARY OF THE INVENTION

It is an object of the present invention to provide a circuit arrangement with a better discharge time.

This object is achieved by using a first and a second discharge circuit, whereby the first discharge circuit discharges the energy source and the second the capacitance of the capacitively coupled switching device. The first discharge circuit provides a current source controlled by a band gap circuit. The second discharge circuit provide a SCR.

The current source can be formed by a differential amplifier fed by the band gap voltages of two transistors.

In addition a start up circuit can be provided which brings the current source close to its operational point.

A further embodiment comprises an overload protection circuit which turns off the MOSFET dependent on the current through the load path of the MOSFET. This current can be measured by means of a resistor in series with the load path of the MOSFET.

BRIEF DESCRIPTION OF THE DRAWINGS

FIG. 1 is a schematic diagram of an optically coupled relay including a discharge circuit employing a resistor according to the state of the art, FIG. 2 is a schematic diagram of an optically coupled relay according to the present invention.

DESCRIPTION OF THE PREFERRED EMBODIMENTS

Figure 3:
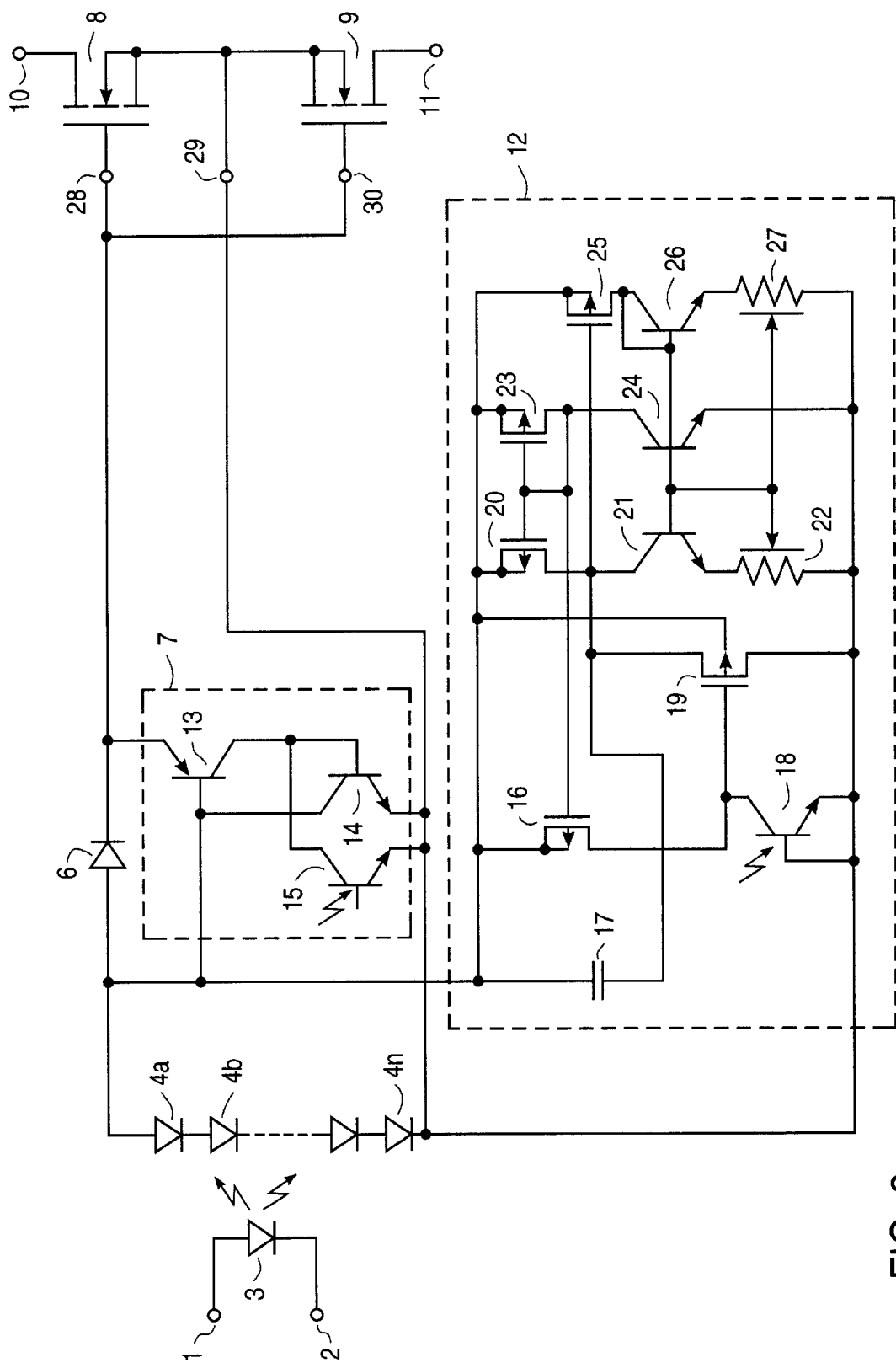
FIG. 3 is a first embodiment of an optically coupled relay according to the present invention.

FIG. 1 shows a circuit arrangement according to the state of the art. Numerals 1 and 2 indicate terminals connecting a light emitting diode 3 which serves as an activating unit optically coupled to a plurality of photo diodes 4a, 4b, . . . 4n connected in series. A resistor 5 is connected in parallel to the photo diodes 4a, 4b, . . . 4n. The positive output of the photo diodes 4a, 4b, . . . 4n is connected to the anode of a further diode 6 and the base electrode of a bipolar pnp transistor 7 whose emitter connects to the cathode of the diode 6. The collector electrode of transistor 7 is connected to the negative output of the photo diodes 4a, 4b, . . . 4n. The switching elements proper are here two MOSFETs 8 and 9 whose source electrodes are connected to each other and whose drain electrodes are connected to respective terminals 10 and 11 which form the relay switch contacts. The gate electrodes of both MOSFETs 8 and 9 are connected to each other and to the cathode of the diode 6. The coupled source electrodes are connected to the negative output of the photo diodes 4a, 4b, . . . 4n.

With a sufficient voltage at the terminals 1 and 2 the LED 3 is lit. The photo diodes 4a, 4b, . . . 4n then generate a voltage which is fed to the gates of the MOSFETs 8 and 9 through the diode 6. This causes the MOSFETs to switch into a conductive state. If the LED 3 is turned off, the resistor 5 discharges the photo diodes 4a, 4b, . . . 4n, thereby causing a voltage drop across the diode 6. This turns the transistor 7 into a conductive state discharging the gate source capacity of the both MOSFETs 8 and 9. Thus the MOSFETs 8 and 9 will be turned off.

In FIG. 2 the same elements have the same numerals. Instead of the resistor 5 a current source 12 is provided which is connected in parallel to the photo diodes 4a, 4b, . . . 4n. To discharge the capacitively charged device generally any controllable switch 7a, such as a bipolar transistor, a field effect transistor, a silicon-controlled rectifier etc., can be used. To show that there are different possibilities to form the power switch, FIG. 2 shows only one MOSFET 8 for which the load path forms the relay switch path.

The current source 12 is preferably an active circuit to provide, in general, the same discharge current as the resistor 5 in FIG. 1. In the preferred embodiment. A band gap reference is provided to regulate the current to achieve consistent circuit performance.. This band gap reference serves as a control unit for the current source to provide a fast discharge of the power source 4a, 4b, . . . 4n.

FIG. 3 shows a preferred embodiment of the present invention. The same elements again have the same numerals. This circuit shows MOSFETs 8 and 9 as in FIG. 1 which are, for example, connected through terminals 28, 29 and 30 to control/discharge circuitry. A first discharge circuit 7 is formed by a bipolar pnp transistor 13 and a bipolar npn transistor 14. These transistors 13, 14 are connected to each other to form a SCR or thyristor. Therefore the emitter electrode of transistor 13 is connected to the cathode of diode 6. The base electrode of transistor 13 is connected to the anode of diode 6 and to the collector electrode of transistor 14. The collector electrode of transistor 13 again is connected to the base electrode of transistor 14, whose emitter electrode is connected to the negative output of the photo diodes 4a, 4b, . . . 4n. In addition a photo npn transistor 15 is provided, whose photo sensitive base is optically coupled with the photo diodes 4a, 4b, . . . 4n and therefore with the LED 3. The collector of transistor 15 is connected to the base of transistor 14 and the emitter electrode of both transistors 14 and 15 are connected to each other.

The second discharge circuit 12 comprises two field effect transistors 20 and 23, whose source electrodes are connected to each other and to the positive output of the diodes 4a, 4b, . . . 4n. The gate electrodes are connected to each other and to the drain electrode of transistor 23. Two bipolar npn transistors 21 and 24 are provided whose collector electrodes are connected to the drain electrodes of transistors 20 and 23, respectively. The base electrodes of both transistors 21 and 24 are connected to each other. The circuit further comprises two resistors 22 and 27. The epi region, in which the resistors 22 and 27 are, is connected to the base electrode of transistor 21. The resistor path of the resistor 22 is connected between the emitter electrode of transistor 21 and the negative output of the photo diodes 4a, 4b, . . . 4n. The base electrode of transistor 24 is connected to the base and the collector electrode of a further npn transistor 26, whose emitter electrode is coupled to the negative output of the photo diodes 4a, 4b, . . . 4n via the resistor path of the resistor 27. The collector electrode of transistor 26 is connected to the drain of a further field effect transistor 25 whose source electrode is connected to the source electrodes of transistors 20 and 23. The gate electrode of transistor 25 is connected to the drain electrode of transistor 20. The source electrode of a further field effect transistor 16 is connected to the positive output of the photo diodes 4a, 4b, . . . 4n. The gate electrode of transistor 16 is connected to the gate electrodes of transistors 20 and 23. Its drain electrode is connected to the collector of a further photo transistor 18, for which the base and emitter electrodes are connected to each other and to the negative output of the photo diodes 4a, 4b, . . . 4n. A capacitor 17 is connected between the positive output of the photo diodes 4a, 4b, . . . 4n and the collector electrode of transistor 21. Finally, field effect transistor 19 is provided, for which the gate electrode connects to the drain electrode of transistor 16 and the source electrode is connected to the drain electrode of transistor 20. The drain electrode of transistor 19 is connected to the negative output of the photo diodes 4a, 4b, . . . 4n. All bulk electrodes of the field effect transistors are connected to the positive output of the photo diodes 4a, 4b, . . . 4n.

The discharge circuit 12 has a specific operating point and a specific temperature coefficient. The bipolar transistors 21 and 24 form a band gap circuit together with the resistor 22. The transistors 20, 23, 25 and 26 form a differential amplifier. The operational point of this amplifier is stabilized by a negative feed back. To start the band gap reference an additional start up circuit is provided. This start up circuit consists of the two field effect transistors 16 and 19 and a photo diode formed by the photo transistor 18. This photo diode 18 pulls the gate of transistor 19 to the negative output (ground) of the circuit. Transistor 19 provides the start up current for transistor 25. Once the circuit gets close to its operating point, transistor 16 turns on and pulls the gate of transistor 19 positive, thus turning it off. This effectively takes the start up section out of the circuit. The above described circuit acts then like a large resistor without taking up all the area an equivalent physical resistor would take up.

This circuit can be made using conventional integrated circuit processing. The temperature coefficient can be adjusted as desired; it can be positive, negative or zero.

When the photo diode array 4a, 4b, . . . 4n powers the circuit diode 6 passes this signal to the gates of the MOSFETs 8 and 9, turning them on. The transistors 13 and 14 form an SCR or thyristor. In this state photo transistor 15 shunts the base/emitter of transistor 14, making the SCR less sensitive. The positive voltage provided by the photo diodes 4a, 4b, . . . 4n reverse biases the base/emitter of transistor 13 and prevents the SCR from triggering.

When the light of LED 3 is turned off, transistor 15 turns off and the voltage at the base of transistor 13 is decreasing due to discharge circuit 12, while the voltage at the emitter of transistor 13 is held up by the input capacitance of the MOSFETs 8 and 9. The band gap controlled current source 12 discharges the photo diode array 4a, 4b, . . . 4n and, when the base/emitter voltage of transistor 13 is negative enough, it turns on the SCR and discharges the circuit in a very short time (about 100–200 nsec).

Figure 4:
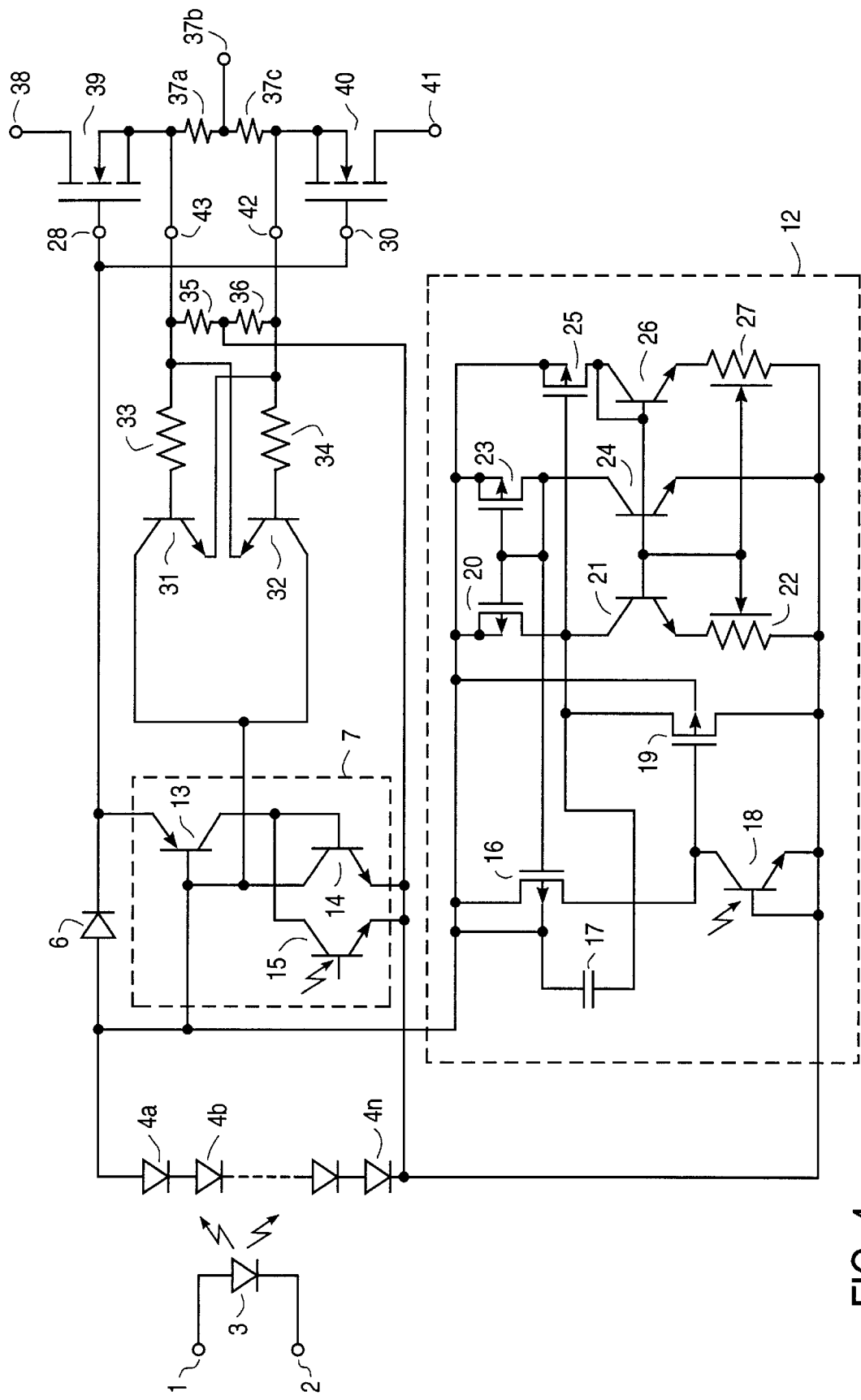
FIG. 4 is a second embodiment of an optically coupled relay according to the present invention.

FIG. 4 shows a second embodiment of the present invention including an overload protection circuit. Again, the same numerals depict the same elements. This circuit is identical to the one shown in FIG. 3 except for a resistor 37a and 37c, which are connected in series between the source electrodes of the two MOSFETs 39 and 40, and a set of additional elements 31 to 36, which form the overload protection circuit. An additional terminal 37b is provided, which connects the centerpoint of the two resistors 37a and 37c. The source electrode of a MOSFET 39 is connected via a terminal 43 through a resistor 33 to the gate electrode of a bipolar npn transistor 31. The source electrode of a MOSFET 40 is connected via a terminal 42 through a resistor 34 to the gate electrode of a bipolar npn transistor 32. Terminals 38 and 41 are connected to the respective drain electrodes of MOSFETs 39 and 40. Two resistors 35 and 36 are connected in series between the terminals 43 and 42. Terminal 43 is further connected to the emitter electrode of transistor 32 and terminal 42 to the emitter electrode of transistor 31. The link between the two resistors 35 and 36 is connected to the negative output of the photo diodes 4a, 4b, . . . 4n. The collector electrodes of transistors 31 and 32 are connected to each other and to the positive output of the photo diodes 4a, 4b, . . . 4n.

If the current through the load path of the MOSFETs 39 and 40 and therefore through the resistors 37a and 37c rises above a predetermined threshold the voltage along resistor 37 triggers one of the transistors 31 and 32, which turns off the MOSFETs 39 and 40.

In AC-applications terminal 37b is not used. In a DC-only application one wire of the external circuit is connected to terminal 37b and the second wire is connected to the terminals 38 and 41, which are first connected to each other.

Figure 5:
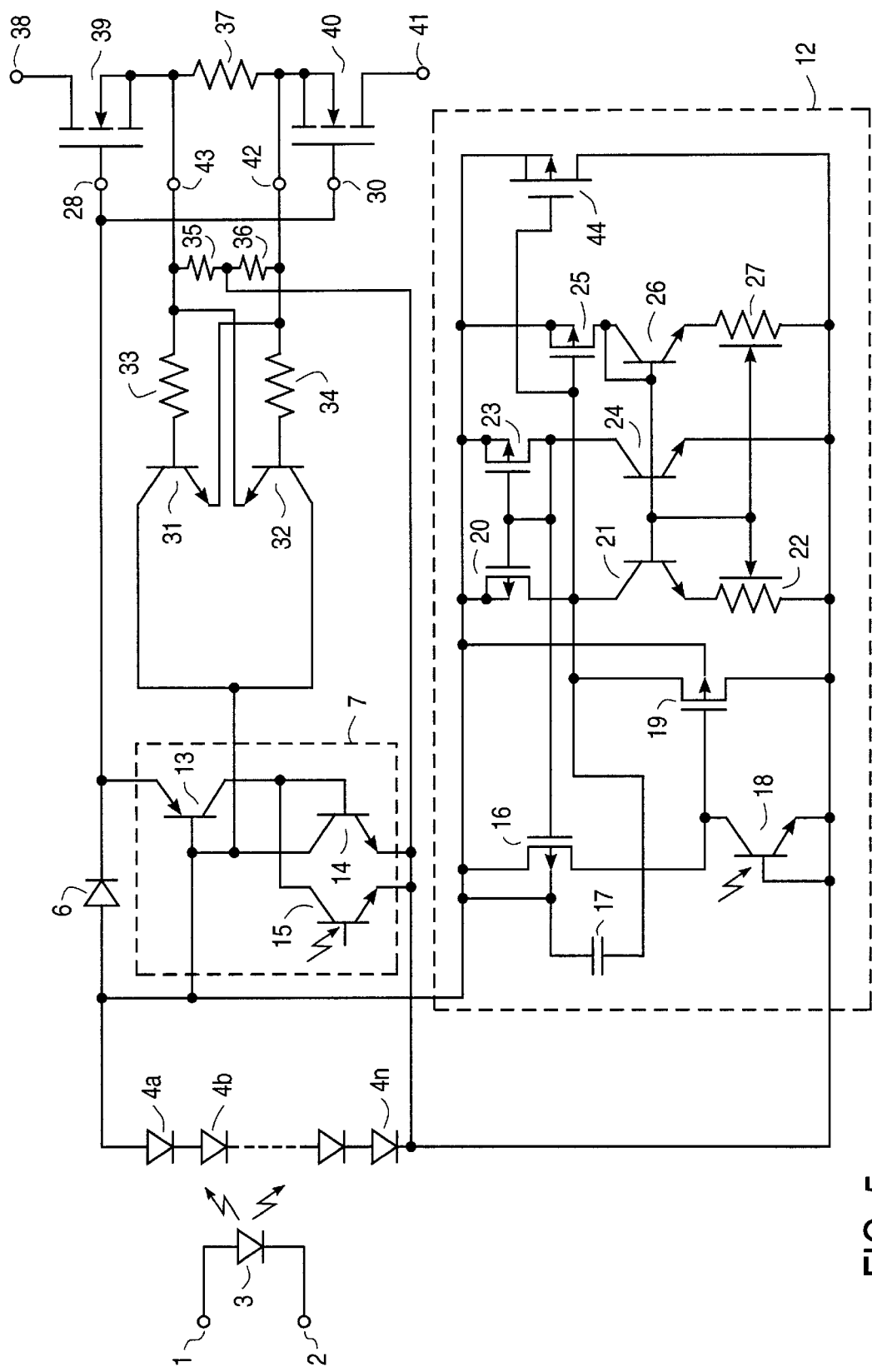
FIG. 5 is a third embodiment of an optically coupled relay according to the present invention.

FIG. 5 shows a third embodiment of the present invention including an overload protection circuit. Again, the same numerals depict the same elements. This circuit is identical to the one shown in FIG. 4 except for a modification. A field effect transistor 44 is provided. The gate electrode of transistor 44 is connected to the gate electrode of transistor 25. The source electrode of transistor 44 is connected to the positive output of the diodes 4a, 4b, . . . 4n and its drain electrode to the negative output of the diodes 4a, 4b, . . . 4n. Instead of resistors 37a and 37c only one resistor 37 is connected between the two transistors 39 and 40. For DC-applications the same arrangement as in FIG. 4 can be used.

The added transistor 44 in this embodiment can further enhance the functionality of the circuit. It has to be considered, that the current to the light emitting diode 3 is increased slowly. Under such a condition the voltage provided from the photo diode array 4a, 4b, . . . 4n to the output transistors 39 and 40 is increasing slowly and the transistors 39 and 40 turn on gradually. In some applications this is highly undesirable. A mechanical relay is either ON fully or OFF fully, there is nothing in between.

By the addition of transistor 44, a higher initial current drain is achieved which has to be overcome by the current from the photo diode array 4a, 4b, . . . 4n. Once this current is exceeded, the current in the added transistor drops in the same way as the startup current, because this transistor is in part controlled by the startup circuit of the bandgap reference. Therefore a mich larger part of the photo diode array output current becomes available to charge the gate of the output transistors 39 and 40. This process results in a much sharper turn on behavior, i.e, the relay will not turn on at all until a threshold current (in the light emitting diode) is reached and then the relay assumes its full current carrying capacity. During turn off the above described process happens in the reverse order. That is, the output conduction of the relay remains nearly the same until the threshold is reached, at which point the relay suddenly turns off imitating a mechanical relay.

This is an option that can also be added, for example, in the same way to the embodiment shown in FIG. 3. However, it is not necessary if the feature it provides (mechanical relay behavior) is not required.

In the claims:

1. A circuit for discharging of a photovoltaic power source having a first and a second terminal, the circuit comprising:
   a photovoltaic power source having a first and a second terminal,
   a controllable discharge circuit being connected between the first and second terminal of the power source for discharging said power source and comprising a controllable current source being controlled by a band gap reference, whereby said controllable current source discharges said power source.

2. A circuit as in claim 1, further comprising:
   a capacitively charged device having a control terminal and a first and second load path terminal,
   a diode connected between the first terminal and the control terminal,
   the second load path terminal of the capacitively charged device is connected to the second terminal,
   a further discharge circuit being connected between the control terminal and the second load path terminal and being controlled by the voltage across said diode.

3. A circuit arrangement as in claim 2, wherein said further discharge circuit comprises a SCR.

4. A circuit arrangement as in claim 3, wherein said SCR comprises a first and second transistor, having emitter, collector and base electrodes, said emitter electrode of said first transistor is connected to said control terminal, said collector of said first transistor is connected to said base electrode of said second transistor, said base electrode of said first transistor is connected to said first terminal and to said collector of said second transistor and said collector of said second transistor is connected to said second terminal,
   a photo transistor is provided having a base, emitter and collector electrode, said base electrode is optically coupled with said photovoltaic elements, said collector of said photo transistor is connected to said base of said second transistor and said emitter of said photo transistor is connected to said second terminal.

5. A circuit arrangement as in claim 1, wherein said controllable current source comprises amplifier means with an input and an output connected between said first and second terminals, said input being coupled with said band gap reference.

6. A circuit arrangement as in claim 5, wherein said current source further comprises a start up circuit generating a signal according to the status of the power source, said amplifier means comprises a transistor with a control input and a load path, said load path is connected in series with said output, said signal being fed to said control input.

7. A circuit arrangement as in claim 6, further comprising a further transistor having a load path and a control input, said load path is connected between said first and second terminals and said signal being fed to said control input of said further transistor.

8. A circuit arrangement as in claim 5, wherein:
   said discharge circuit comprises:
   a first and second field effect transistor having drain, source and gate electrodes, said gate electrodes are connected to each other and said source electrodes are connected to said first terminal,
   a third and fourth transistor, having emitter, collector and base electrodes, said collector of said third transistor is connected to said drain electrode of said first field effect transistor, said collector of said fourth transistor is connected to said drain electrode of said second field effect transistor, said emitter of said fourth transistor is connected to said second terminal and said base electrodes of said third and fourth transistors are connected to each other,
   a third field effect transistor having drain, source and gate electrodes, said gate electrode is connected to said drain electrode of said first field effect transistor, said source electrode is connected to said first terminal,
   a fifth transistor having emitter, collector and base electrodes, said base electrode is connected to its collector electrode and to said drain electrode of said third field effect transistor and to the base electrodes of said third and fourth transistors,
   a first and second controllable resistor having a control electrode and a load path, said load path being connected between said emitter electrodes of said third and fifth transistors respectively and said control inputs are connected to each other and to said base electrodes of said third and fourth transistors.

9. A circuit arrangement as in claim 8, further comprising:
   a fourth field effect transistor having source, drain and gate electrodes, said source being connected to said first terminal and said gate being connected to the gates of said first and second field effect transistors, a fifth field effect transistor having source, drain and gate and a bulk electrode, said source being connected to the drain of said first field effect transistor, said bulk being connected to said first terminal, said drain being connected to said second terminal and said gate being connected to the drain of said fourth field effect transistor, a photo diode, being connected between the drain electrode of said fourth field effect transistor and said second terminal and being optically coupled to said photovoltaic elements.

10. A circuit arrangement as in claim 2, wherein:

said capacitively charged device is a MOSFET having drain, source and gate electrodes, said gate electrode being connected to said control terminal and said drain and source electrodes being connected to said load path terminals, respectively.

11. A circuit arrangement as in claim 2, wherein:

said capacitively charged device comprises two MOSFETs having drain, source and gate electrodes, said gate electrodes being connected to said control terminal and said source electrodes being connected to each other and to said second terminal and said drain electrodes being connected to said load path terminals, respectively.

12. A circuit arrangement as in claim 2, wherein:

said capacitively charged device comprises two MOSFETs having drain, source and gate electrodes, said gate electrodes being connected to said control terminal and said source electrodes being connected to each other via a resistor and said drain electrodes being connected to said load path terminals, respectively, said arrangement further comprises a overload protection circuit which in accordance to the voltage across said resistor generates a signal which controls said discharge circuits.

13. A circuit arrangement as in claim 12, wherein:

said overload protection circuit comprises:
  a second and third resistor being connected in series between said source electrodes of said first and second MOSFET, the junction of said resistors being connected to said second terminal,
  a fourth and fifth resistor,
  a sixth and seventh transistor having emitter, collector and base electrodes, said base electrode of said sixth transistor being connected via said fourth resistor to the source electrode of said first MOSFET, said base electrode of said seventh transistor being connected via said fifth resistor to the source electrode of said second MOSFET, said emitter electrode of said sixth transistor being connected to said source electrode of said second MOSFET, said emitter electrode of said seventh transistor being connected to said source electrode of said first MOSFET and said collector electrodes being connected to each other and to said first terminal.

\* \* \* \* \*